US011412650B2

(12) United States Patent
Eck

(10) Patent No.: US 11,412,650 B2
(45) Date of Patent: Aug. 9, 2022

(54) LEAD TIP ILLUMINATION DEVICE, SYSTEM, AND METHOD

(71) Applicant: Universal Instruments Corporation, Conklin, NY (US)

(72) Inventor: George D. Eck, Binghamton, NY (US)

(73) Assignee: UNIVERSAL INSTRUMENTS CORPORATION, Conklin, NY (US)

(*) Notice: Subject to any disclaimer, the term of this patent is extended or adjusted under 35 U.S.C. 154(b) by 77 days.

(21) Appl. No.: 16/651,721

(22) PCT Filed: Sep. 27, 2018

(86) PCT No.: PCT/US2018/053011
§ 371 (c)(1),
(2) Date: Mar. 27, 2020

(87) PCT Pub. No.: WO2019/067657
PCT Pub. Date: Apr. 4, 2019

(65) Prior Publication Data
US 2020/0260620 A1   Aug. 13, 2020

Related U.S. Application Data

(60) Provisional application No. 62/564,516, filed on Sep. 28, 2017.

(51) Int. Cl.
*B23P 19/00*   (2006.01)
*H05K 13/08*   (2006.01)

(52) U.S. Cl.
CPC ..... *H05K 13/0812* (2018.08); *H05K 13/0813* (2018.08)

(58) Field of Classification Search
CPC .................. H05K 13/0812; H05K 13/0813
See application file for complete search history.

(56) References Cited

U.S. PATENT DOCUMENTS 4,101,259 A   7/1978   Shaffer et al.
4,678,336 A   7/1987   Tsunoda
(Continued)

FOREIGN PATENT DOCUMENTS

CN   85101640 A   1/1987
CN   101032200 A   9/2007
(Continued)

OTHER PUBLICATIONS

International Preliminary Report on Patentability in related PCT Patent Application No. PCT/US2018/053011, dated Mar. 31, 2020. 9 pages.
(Continued)

*Primary Examiner* — Paul D Kim
(74) *Attorney, Agent, or Firm* — Schmeiser, Olsen & Watts, LLP

(57) ABSTRACT

A pick and place machine includes a feeder system configured to feed components to a picking location, a dispensing head configured to pick fed components from the picking location, a vision system configured to detect features of components picked by the dispensing head. The vision system includes an image capture device pointed in a direction. The pick and place machine further includes an illumination device that includes a plurality of light sources each configured to produce light having a controlled thickness and at a controlled angle relative to the direction. The controlled angle is configured to be non-normal with respect to the direction at which the image capture device is pointed.

34 Claims, 9 Drawing Sheets

(56) References Cited

U.S. PATENT DOCUMENTS

| | | |
|---|---|---|
| 5,347,431 A | 9/1994 | Blackwell et al. |
| 5,481,439 A | 1/1996 | Goto |
| 5,515,253 A | 5/1996 | Sjobom |
| 5,519,495 A | 5/1996 | Kawaguchi |
| 5,690,417 A | 11/1997 | Polidor et al. |
| 5,697,699 A | 12/1997 | Seo et al. |
| 5,897,195 A | 4/1999 | Choate |
| 6,031,242 A * | 2/2000 | Hudson .............. H01L 21/681 250/548 |
| 6,106,124 A | 8/2000 | Tarsia |
| 6,211,958 B1 | 4/2001 | Hachiya et al. |
| 6,352,349 B1 | 3/2002 | Braginsky et al. |
| 6,582,090 B1 | 6/2003 | Coots et al. |
| 7,545,514 B2 * | 6/2009 | Manickam ......... H05K 13/0409 356/601 |
| 8,243,285 B2 | 8/2012 | Fishbaine |
| 9,332,686 B2 * | 5/2016 | Yamashita ......... H05K 13/0061 |
| 2001/0048469 A1 | 12/2001 | Eck |
| 2009/0046921 A1 | 2/2009 | Case et al. |
| 2013/0094215 A1 | 4/2013 | Jurik et al. |

FOREIGN PATENT DOCUMENTS

| | | |
|---|---|---|
| CN | 101821581 A | 9/2010 |
| CN | 104048197 A | 9/2014 |
| CN | 105684568 A | 6/2016 |
| KR | 20120031677 A | 4/2012 |

OTHER PUBLICATIONS

International Patent Application No. PCT/US2018/053011, International Search Report and Written Opinion of the International Searching Authority, or the Declaration dated Nov. 30, 2018. 15 pages.

Office Action in corresponding Chinese Patent Application No. 201880061942.7 dated Dec. 23, 2020. 11 pages.

* cited by examiner

LEAD TIP ILLUMINATION DEVICE, SYSTEM, AND METHOD

RELATED APPLICATIONS

This application claims priority to International Patent Application No. PCT/US2018/53011, filed Sep. 27, 2018, entitled "Improved Lead Tip Illumination Device, System, and Method," which claims priority to U.S. Provisional Application No. 62/564,516 filed Sep. 28, 2017 entitled "Improved Lead Tip Illumination Device, System, and Method," the disclosures of which is hereby incorporated by reference to the extent that they are not inconsistent with the present disclosure.

TECHNICAL FIELD

Printed circuit board vision systems, and more specifically, vision processing during the transportation or movement of devices or components in an automated electronics assembly system.

BACKGROUND

Pick and place machines may be used to assemble products such as printed circuit boards (PCBs), for example, by picking and placing components onto PCBs. A component often has one or more attachment points, e.g. lead tips, by which the component attaches to a PCB. The position of the attachment points of a component are often determined before the component is attached to a PCB in order to ensure the attachment points are attached to the PCB in the correct orientation. This may be accomplished by a vision system, which may view the attachment points and determine the position of the attachment points before the component is placed. Determining the position of the attachment points of a component may be accomplished after the component has been picked, and before the component is placed on a PCB, for example, while the component is being moved to a PCB from a pick location at a feeder bank. Accurate determination of the position of the attachment points is used to prevent components being attached to PCBs in an inaccurate orientation which can cause a PCB to be defective. An illumination device that reliably and precisely illuminates attachment points of components for determination of the position of the attachment points would be well received in the art.

SUMMARY

A first aspect relates to a pick and place machine comprising a feeder system configured to feed components to a picking location; a dispensing head, the dispensing head configured to pick fed components from the picking location; a vision system configured to detect features of components picked by the dispensing head, the vision system comprising an image capture device pointed in a direction; and an illumination device, the illumination device comprising a plurality of light sources each configured to produce light having a controlled thickness and at a controlled angle relative to the direction, wherein the controlled angle is configured to be non-normal with respect to the direction.

A second aspect relates to a vision system configured to detect features of components picked by a dispensing head, the vision system comprising an image capture device pointed in a direction; and an illumination device comprising a plurality of light sources each configured to produce light having a controlled thickness and at a controlled angle relative to the direction, wherein the controlled angle is configured to be non-normal with respect to the direction.

A third aspect relates to a method of illuminating a component comprising providing a pick and place machine comprising a feeder system; a dispensing head; and a vision system comprising: an image capture device; and an illumination device comprising a plurality of light sources; feeding, by the feeder system, a component to a picking location; picking, by the dispensing head, a fed component from the picking location; pointing the image capture device in a direction; producing, by each of the plurality of light sources, a light; controlling, by the illumination device, a thickness of each light; controlling, by the illumination device, a controlled angle of each light relative to the direction such that each controlled angle is non-normal with respect to the direction; illuminating, by the plurality of light sources, features of the fed component; capturing, by the image capture device, an image of the fed component; and detecting, by the vision system, features of the fed component.

BRIEF DESCRIPTION OF THE DRAWINGS

Some of the embodiments will be described in detail with references made to the following figures, wherein like designations denote like members, wherein.

DETAILED DESCRIPTION

A detailed description of the hereinafter-described embodiments of the disclosed apparatus and method are presented herein by way of exemplification and not limitation with reference made to the Figures. Although certain embodiments are shown and described in detail, it should be understood that various changes and modifications might be made without departing from the scope of the appended claims. The scope of the present disclosure will in no way be limited to the number of constituting components, the materials thereof, the shapes thereof, colors thereof, the relative arrangement thereof, etc., and are disclosed simply as an example of embodiments of the present disclosure. A more complete understanding of the present embodiments and advantages thereof may be acquired by referring to the following description taken in conjunction with the accompanying drawings, in which like reference numbers indicate like features.

Figure 1:
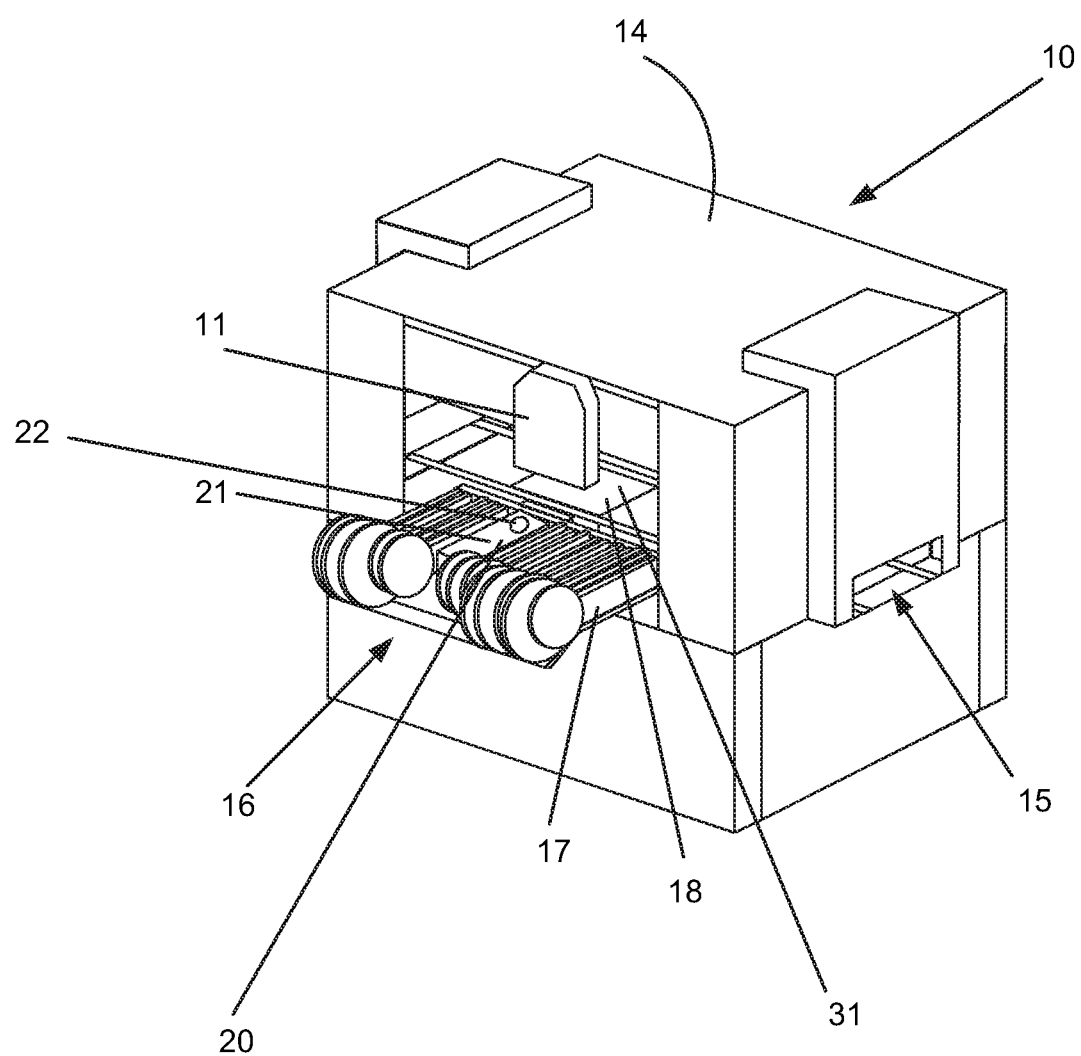
FIG. 1 depicts a perspective view of a pick and place machine according to one embodiment.

Referring to FIG. 1, a perspective view of an embodiment of a pick and place machine 10 is shown. In the embodiment shown, the pick and place machine 10 includes a machine housing 14. The pick and place machine 10 includes a feeder system 16, which has a plurality of feeders 17. The plurality of feeders 17 may contain or be loaded with components, such as electronic components or devices that may ultimately be placed or otherwise positioned onto a PCB, for example, PCB 18. The electronic components, feeders 17, various other component elements and overall arrangement of the feeder system 16 may vary according to the desired operability. For example, the number, size, and shape of the feeders 17 may vary according to the component size and intended orientation of the components on the PCBs. The pick and place machine 10 also includes a PCB handling system 15. The PCB handling system 15 may be configured to transport the PCB 18 through the pick and place machine 10. For example, the PCB handling system 15 may comprise a transport belt, conveyor, and the like that moves the PCB 18 from one location in the pick and place machine to another. PCBs such as PCB 18 may enter and exit the pick and place machine 10 via the PCB handing system 15. The PCB handling system 15 may be configured to operate with the feeder system 16 such that components may be moved to PCBs being moved by the PCB handling system.

The pick and place machine 10 includes a pick and place head 11. The pick and place head 11 may be configured to pick components from a picking location, for example, a feeder 17. The pick and place head 11 may be configured to place components onto a PCB 18, such that the components may be attached to the PCB 18. The pick and place head 11 may be configured to pick and/or place one or more components simultaneously. The pick and place head 11 may be a dispensing head. The pick and place head 11 may include a plurality of spindles each configured to pick one or more components. The spindles may be configured such that multiple spindles may be used to pick a single component, for example, a component that is too large for a single spindle to pick. The PCB handling system 15 includes a placement location 31 at which components may be placed onto a PCB 18 and attached to a PCB 18.

The pick and place machine 10 includes a vision system that includes an image capture system 20. The vision system may include a controller. The image capture system 20 includes an image capture device 21 and an illumination device 22. The image capture system 20 may include one or more image capture devices, such as or similar to the image capture device 21. The image capture system 20 may include one or more illumination devices, such as or similar to the illumination device 22. The image capture device 21 may be a camera. The image capture device 21 may point in direction 71. The direction 71 in which the image capture device 21 may point may be determined by a centerpoint of an image configured to be captured by the image capture device 21. The image capture device 21 may be fixed such that the image capture device 21 may always be pointed in the same upward direction 71. In other embodiments, the image capture device 21 may be configured to move. The vision system is configured to detect features of a component, such as attachment points of the component at which the component may be attached to a PCB 18. Features of a component may include leads. Features of a component may include one or more protrusions.

The illumination device 22 may illuminate a portion of a component, such as features of a component, by one or more light sources. The image capture device 21 is configured to capture an image of features of a component that are illuminated by one or more light sources. The vision system may detect from the image or images captured by the image capture device 21, the features of a component, including the position and or orientation of the features of the component. For example, the image or images of the features may be processed with machine vision software such that the vision system can determine the positions of the features.

As an example, a PCB 18 may enter the pick and place machine via the PCB handling system 15. The PCB 18 may be transported by the PCB handling system 15 to a placement location 31. The pick and place head 11 may pick a component from a feeder 17, move the component to the image capture system 20. Once the component is moved to the image capture system 20, the pick and place head 11 may move the component through the illumination device 22. As the component is being moved through the illumination device 22, light sources of the illumination device 22 may illuminate the features of the component, such as lead tips of the component. While the features are illuminated, the image capture device 21 may capture one or more images of the illuminated features of the component. The vision system may detect the positions of the features of the component. For example, the one or more images may then be processed, for example, by machine vision software to determine the positions of the features of the component. The pick and place head 11 may move the component to the PCB 18 and place the component onto the PCB 18 based on the detected positions of the features, such that the features are correctly oriented on the PCB 18 when the component is attached to the PCB. The PCB 18 may exit the pick and place machine via the PCB handling system 15. The vision system may be configured to detect features of component moved through the illuminated device 22 by the pick and place head 11 on the fly.

Figure 2:
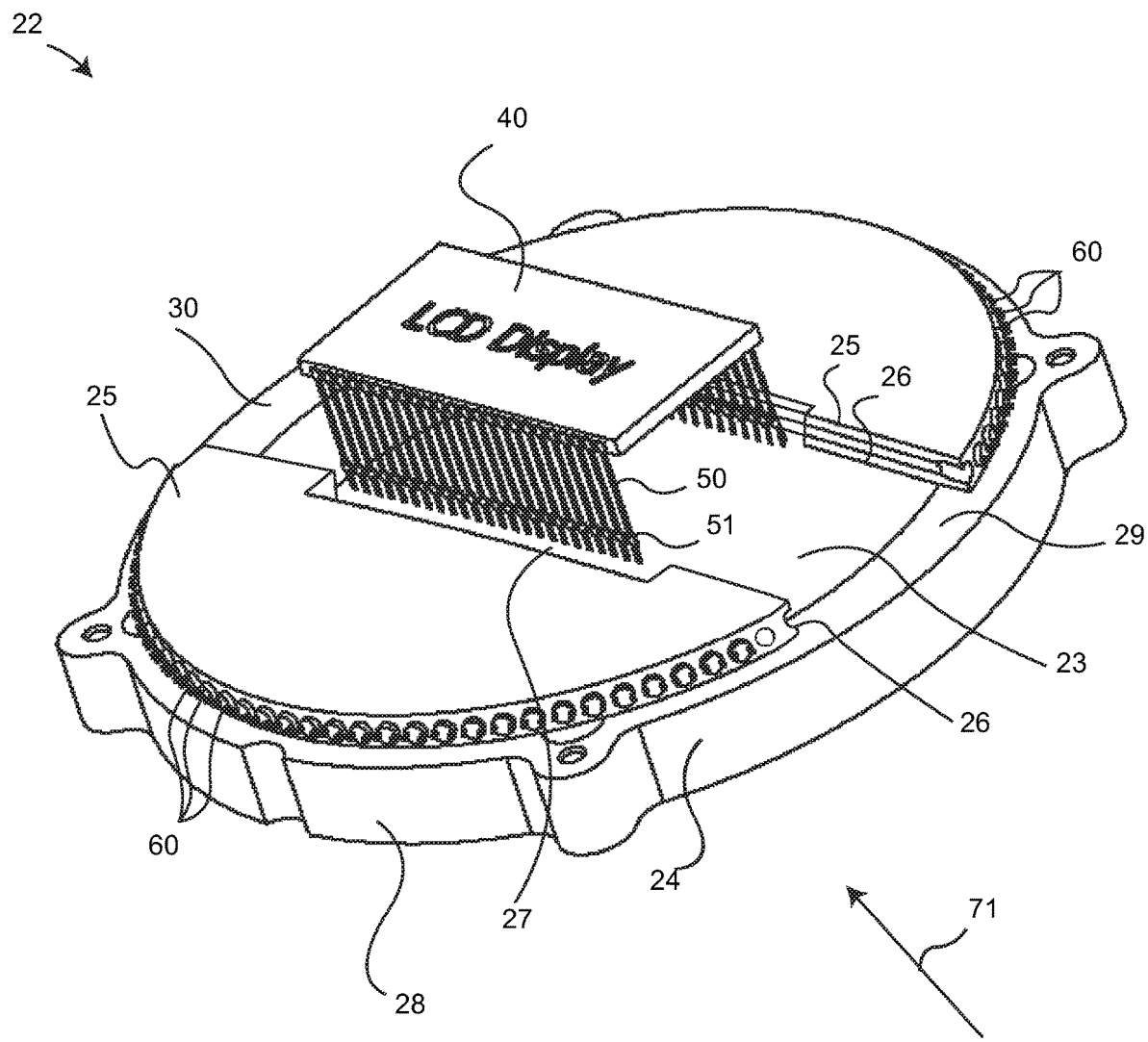
FIG. 2 depicts a perspective view of an illumination device of the pick and place machine of FIG. 1 with a component in an inspection position according to one embodiment.

An embodiment of the illumination device 22 is shown in more detail in FIG. 2, which provides a perspective view of an embodiment of an illumination device 22. The embodiment shown has a housing 24, and an outer edge 28. The housing 24 is ring shaped. In other embodiments, the housing 24 may have a different shape, such as a rectangle, an oval, a triangle, and the like. The housing 24 includes an opening 23 that extends between a first side 29 of the outer edge 28 to a second side 30 of the outer edge 28. The opening 23 may be a channel that extends across the housing 24. The opening 23 is shown having a widened portion 27 in the center of the opening 23. On either side of the opening 23 is an upper baffle 25 and a lower baffle 26 extending inward from the outer edge 28. The opening 23 is configured to receive components, for example, by a pick and place head 11 moving the components into the opening 23 via the first side 29 of the outer edge 28, or via the second side 30 of the outer edge 28. In some instances, a user may require determining the position of features on a component that is too large to be moved through the opening 23 via the first side 29 or the second side 30. The widened portion 27 is configured to accommodate components that are too large to be moved through the opening 23. Such components may be lowered, for example, by the pick and place head 11, directly into the widened portion 27.

The illumination device 22 has a plurality of light sources 60 that are disposed about the housing 24. The plurality of light sources 60 may be disposed at or proximate to the outer edge 28. Each light source of the plurality of light sources 60 is disposed in between an upper baffle 25 and a lower baffle 26 such that light produced by the plurality of light sources 60 is confined in between an upper baffle 25 and a lower baffle 26 until the light reaches the opening 23. The upper baffles 25 and the lower baffles 26 may prevent stray light from striking and illuminating the body of a component. Stray light may inhibit vision processing of features of the component because for example, stray light may illuminate background features of a component, and these illuminated background features may be incorrectly identified by the vision system as protrusions, which can cause incorrect placement of a component on a PCB.

Figure 6:
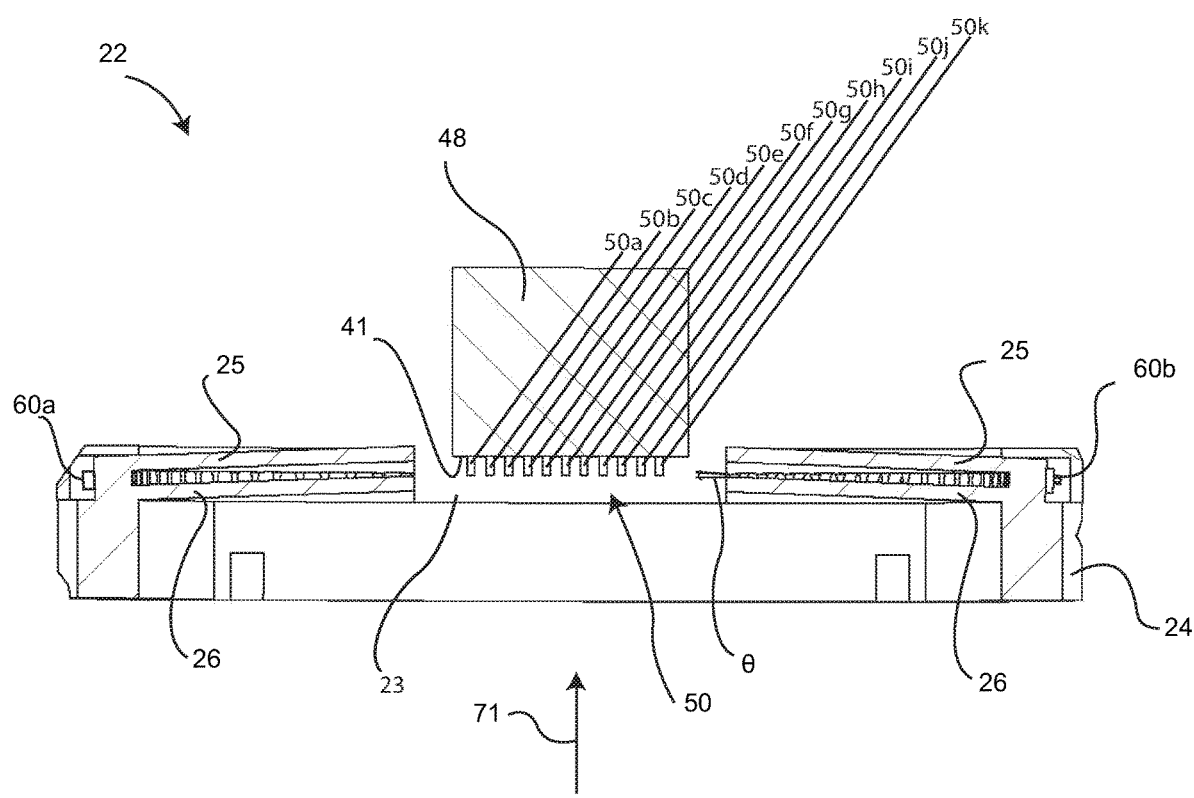
FIG. 6 depicts a cross sectional side view of the illumination device and component of FIG. 3 taken at arrows A-A in FIG. 3, according to one embodiment.
Figure 9:
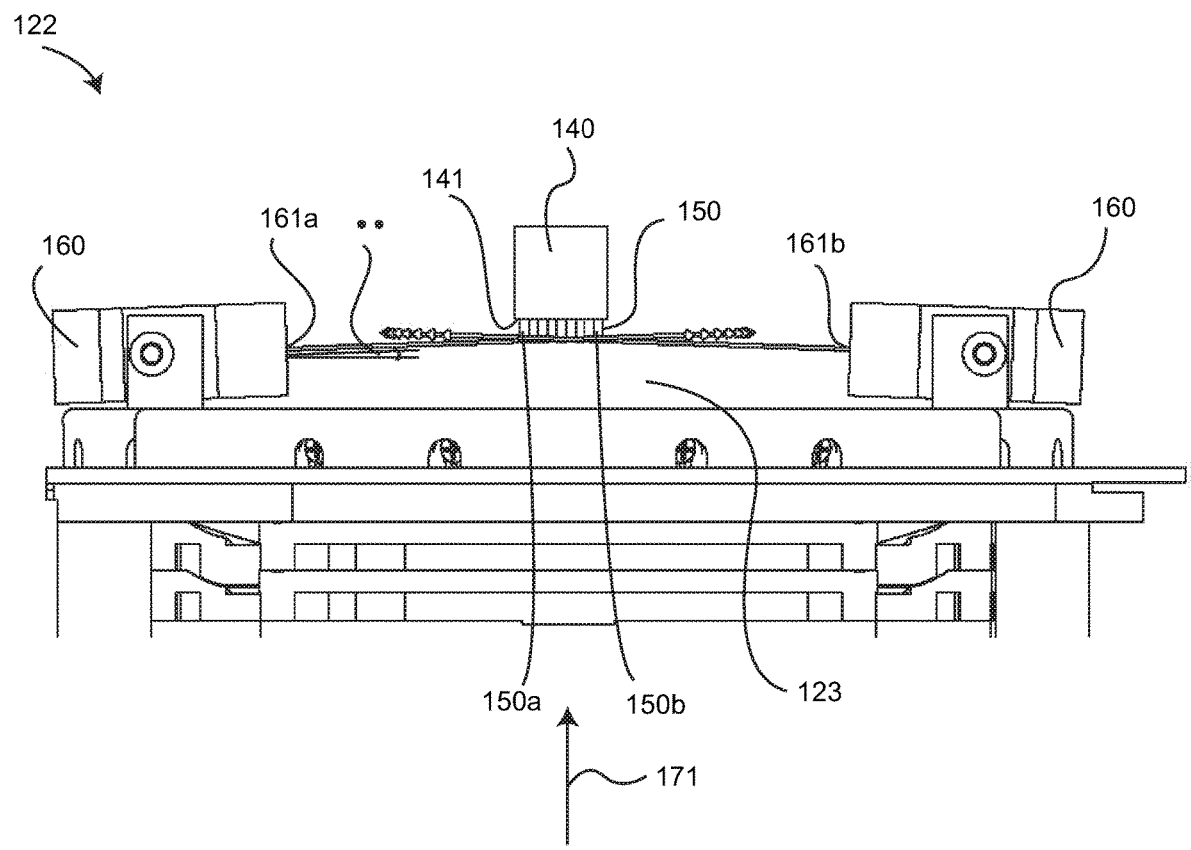
FIG. 9 depicts a cross-sectional side view of the illumination device and the component of FIGS. 7 and 8 taken at arrows B-B in FIG. 8, according to an embodiment.

The upper baffles 25 and the lower baffles 26 are configured to control the path of illumination in the opening 23. The upper baffles 25 and lower baffles 26 may be configured such that each light source of the plurality of light sources 60 produces a light having a controlled thickness and at a controlled angle θ (as shown in FIGS. 6 and 9 and described hereinafter) relative to the direction 71 in which the image capture device 21 points. The controlled angle θ of the light of each light source is configured to be non-normal with respect to the direction 71 of the image capture device 21. In the embodiment shown in FIG. 2, each light source of the plurality of light sources 60 is an LED. The light of each LED is directed by the upper baffles 25 and lower baffles 26 to the opening 23.

Shown above the illumination device 22 in FIG. 2 is a component 40 that has a plurality of protrusions 50 extending from the component 40. The component has a background feature 41 (not shown), that may be a face, surface, side, portion, and the like of the component from which the plurality of protrusions extend 50. The background feature 41 may be background geometry. The plurality of protrusions 50 may be metal leads such as lead tips. The plurality of protrusions 50 may be attachment points by which the component 40 may attach to a PCB.

In order to determine the positions of the plurality of protrusions 50, the component 40 may be moved down into the widened portion 27. Each LED of the plurality of light sources 60 may then produce a light. The upper baffles 25 and lower baffles 26 may control the path of illumination of the light of each LED into the opening 23. The upper baffles 25 and the lower baffles 26 control the thickness of each light and control the angle of the light of each LED such that the light of each LED has a controlled thickness and a controlled angle θ. Each controlled angle θ may be non-normal with respect to the direction 71 that the image capture device 21 is pointed. By controlling the angle of the light of each LED such that each controlled angle θ of the light of each LED is non-normal with respect to the direction 71 of the image capture device 21, any protrusions of the plurality of protrusions 50 that are in between other protrusions of the plurality of protrusions 50 and the LEDs do not prevent those other protrusions from being illuminated by blocking light or creating shadow. For example, the controlled thickness and the controlled angle θ of each light produced by the plurality of light sources 60 may be configured such that the protrusions of the plurality of protrusions 50 that are located closest to each LED are illuminated by that LED proximate to the tips of those protrusions—in other words, farther from the background feature 41—and the protrusions of the plurality of protrusions 50 that are farthest from each LED are illuminated by that LED higher on those protrusion—in other words, closer to the background features 41.

The controlled angle θ of the light of each LED of the plurality of light sources 60 may be an angle θ from the normal with respect to the direction 71 that causes each protrusion of the plurality of protrusions 50 to be illuminated such that the background feature 41 is not illuminated. For example, each controlled angle θ of the light of each LED may be between 1 and 2 degrees from the normal with respect to the direction 71 pointed at by the image capture device 21. For example, the controlled angle θ of light may be 1.5 degrees from the normal with respect to the direction 71 pointed at by the image capture device 21. In another embodiment, the controlled angle θ of light may be 1 degree from the normal with respect to the direction 71 pointed at by the image capture device 21. In another embodiment, the controlled angle θ of light may be 2 degrees from the normal with respect to the direction 71 pointed at by the image capture device 21.

In one embodiment, each controlled angle θ of the light of each LED may be equal. In others, the controlled angles may have some degree of variance. For example, the controlled angles of each successive LED may follow a pattern such as 1 degrees, 1.5 degrees, 2 degrees, 1 degree, 1.5 degrees, 2 degrees, etc. Other patterns are contemplated. Whatever the embodiment, one or more of the LEDs may be angled relative to the plane that is normal to the direction 71 at which the image capture device 21 is pointed. In whatever embodiment of LEDs, the light produced by the LEDs may be configured to illuminate the plurality of protrusions 50 of the component such that the background feature 41 is not illuminated.

As an example, the upper baffles 25 and the lower baffles 26 may be angled upward towards a component located in the opening 23. The upper baffles 25 and the lower baffles 26 may be angled in an acute angle such as 1 or 2 degrees. The angle of the upper baffles 25 and the lower baffles 26 may be modified to more or less than 2 degrees, for example, depending on the range of components being processed by the pick and place machine, and/or based on the overall size of the components and length of the plurality of protrusions relative to the body of the components. The angle of the upper baffles 25 and the lower baffles 26, and the spacing of the upper baffles from the lower baffles may, for example, be chosen based on the dimensions, for example, X-axis and Y-axis size, and length of the plurality of protrusions 50 or the components to be imaged. The upper baffles 25 and the lower baffles 26 may be adjustable such that the upper baffles 25 and the lower baffles 26 are configured to change angle, and change the amount of space in between the upper baffles 25 and the lower baffles 26, in order to permit components of different sizes, dimensions, and having protrusions of different lengths to be illuminated such that only the protrusions 50 are illuminated and the background features 41 are not illuminated. As an example, component 40 may be an LCD display, which may have long lead tips. The long lead tips of an LCD display may comprise standoffs 51 that are close to the ends of the lead tips. Standoffs 51 may interfere with imaging of the lead tips; for example, each standoff may be wider than each lead tip. In this instance, if the light from the plurality of light sources 60 illuminates the standoffs 51, the positions of the lead tips may not be accurately detected. In this situation, the upper baffles 25 and the lower baffles 26 may be configured to illuminate the lead tips on the portions of the lead tips between the lead tip ends and the standoffs, without illuminating the standoffs 51. For example, the upper baffles 25 and the lower baffles 26 may adjust the controlled angle θ and controlled thickness of each light produced by each light source of the plurality of light sources 60.

The controlled thickness of the light produced by each LED of the plurality of light sources 60 may be increased or decreased based on a length of each protrusion of the plurality of protrusions 50. For example, if the plurality of protrusions 50 are longer, the controlled thickness of the light of each LED may be increased by the upper baffles 25 and the lower baffles 26. Likewise, the controlled thickness of the light produced by each LED may be decreased by the upper baffles 25 and the lower baffles 26 if the plurality of protrusions 50 is shorter. By only illuminating the plurality of protrusions 50 and not the background feature 41, the accuracy of any image or images captured of the illuminated plurality of protrusions 50 may be increased. The accuracy of any image or images captured may decrease when portions of the background feature 41 are illuminated, because these illuminated background feature 41 portions can be mistaken for a protrusion of the plurality of protrusions 50 and result in an incorrect determination of the positions of each protrusion of the plurality of protrusions 50.

Figure 3:
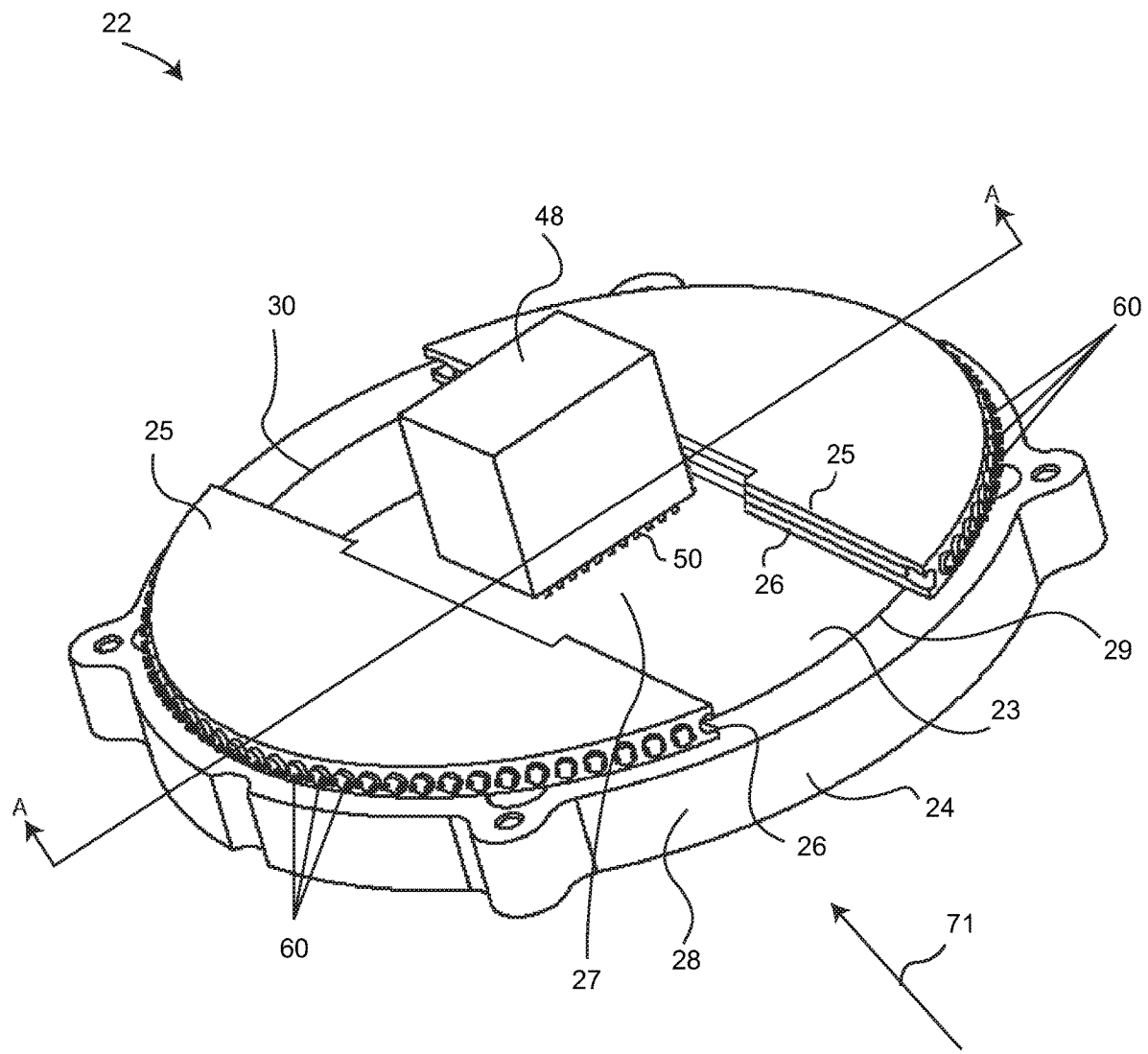
FIG. 3 depicts a perspective view of the illumination device of FIG. 2 with a different component in an inspection position according to one embodiment.

With reference to FIG. 3, the illumination device 22 is shown with a different component 48 in an inspection position having been moved into the opening 23. Component 48 may be a component that is smaller than component 40. Component 48 may be moved into the opening 23 by the pick and place head 11 via the first side 29 or the second side 30 rather than being moved directly down into the widened portion 27.

Figure 4:
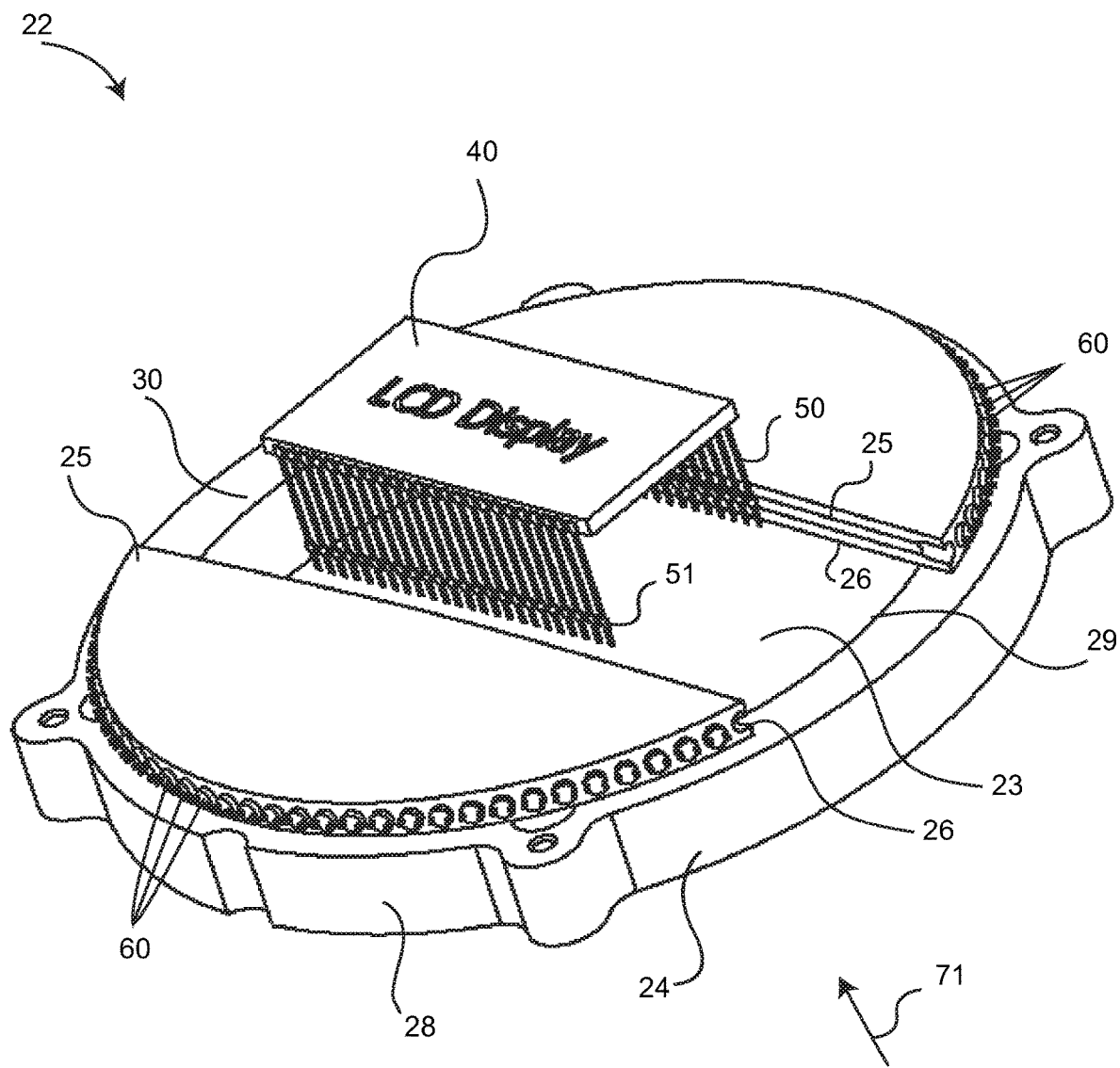
FIG. 4 depicts a perspective view of an illumination device of the pick and place machine of FIG. 1 with a component in an inspection position according to another embodiment.
Figure 5:
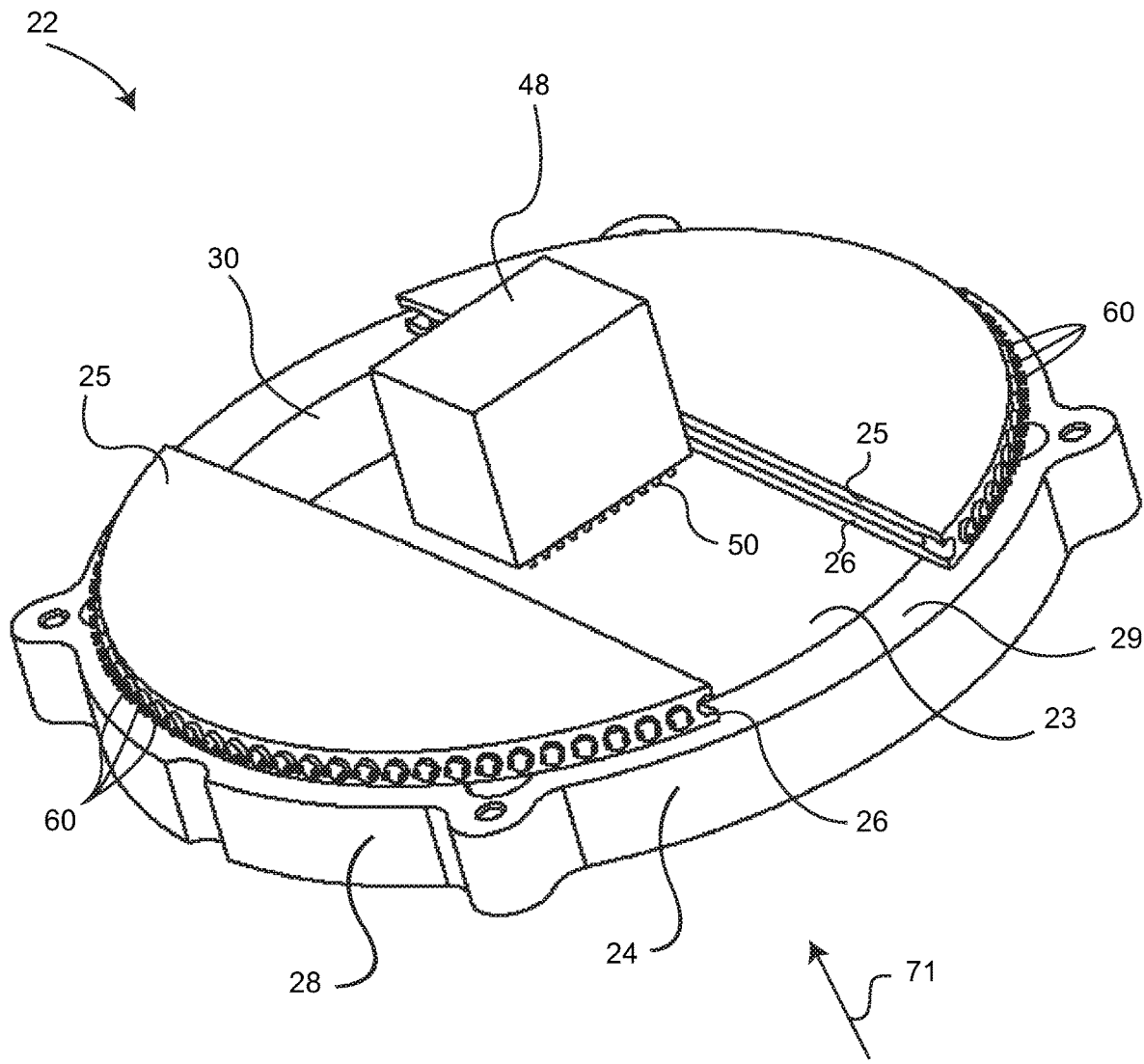
FIG. 5 depicts a perspective view of the illumination device of FIG. 4 with a different component in an inspection position according to one embodiment.

In another embodiment, the illumination device 22 may have an opening 23 that is the same width extending between the first side 29 and the second side 30 as shown in FIGS. 4 and 5. For example, the opening 23 may be configured such that a larger component such as component 40 may be moved through the opening 23, as shown in FIG. 4. As another example, the opening 23 may be configured such that a component that is smaller than component 40, such as component 48 may be moved through the opening 23, as shown in FIG. 5.

Referring now to FIG. 6, a cross section side view of an embodiment of an illumination device 22 and a component 48 having been moved into an opening 23 of the illumination device 22 is shown. The component 48 has a plurality of protrusions 50, including protrusions 50a-50k, that are pointed downwards into the opening 23. Shown on either side of the opening 23 are an upper baffle 25 and a lower baffle 26, with a light source 60a, 60b of a plurality of light sources 60, for example, LEDs, disposed in between the upper baffles 25 and lower baffles 26. Each light source of the plurality of light sources 60 may be configured such that the light produced by each light source of the plurality of light sources 60 is emitted at an angle that is non-normal with respect to the direction 71. In this embodiment, each of the plurality of light sources 60 may be oriented, disposed, pointed, or configured in a direction that is angled with the same angle as the space created between the upper and lower baffles 25, 26. Thus, if the upper and lower baffles 25, 26 are angled at 1-2 degrees from the normal of the direction 71, the plurality of light sources 60 may likewise be disposed at this same 1-2 degree angle from the normal of the direction 71. In another embodiment, the plurality of light sources 60 may not be oriented, disposed, pointed or configured with the same angle relative to the space created between the upper and lower baffles 25, 26. For example, each light source of the plurality of light sources 60 may be configured such that the light produced by each light source of the plurality of light is emitted perfectly orthogonally with respect to direction 71, i.e. perfectly normal to the direction 71. In this embodiment, the space created between the upper and lower baffles 25, 26 may remain at an angle. In this embodiment, light emitted by the plurality of light sources 60 may be directed by the angled upper and lower baffles 25, 26 through reflection of the light off the baffles, thereby emerging from the baffles into the opening 23 at the non-normal angle of the upper and lower baffles 25, 26.

The upper baffles 25 and the lower baffles 26 are shown positioned in an angle θ relative to direction 71 such that the angle is non-normal with respect to the direction 71. Direction 71 is the direction in which an image capture device 11 is pointed to view the plurality of protrusions 50 of the component 48 when the protrusions 50 are illuminated by the illumination device 22. Direction 71 is shown pointing straight up towards the plurality of protrusions 50. In some embodiments, the direction 71 at which an image capture device 11 is pointed to view the plurality of protrusions 50 may be at another angle with respect to the component 48. The angle of the upper baffles 25 and lower baffles 26 is configured to direct light produced by the plurality of light sources 60 toward the opening 23 at a controlled thickness and a controlled angle θ such that each protrusion of the plurality of protrusions 50 is illuminated, and such that the background feature 41 of the component 48 is not illuminated. In some embodiments, the controlled angle θ may be controlled by the angle of the upper baffles 25 and the lower baffles 26 as well as by the angle of each light source of the plurality of light sources 60.

The controlled angle θ and controlled thickness of each light source of the plurality of light sources 60 is configured such that the light produced by each light source illuminates the protrusion or protrusions closest to each light source—which may be referred to as near protrusions—at a location on the near protrusion or near protrusions proximate to the tip of the near protrusion or near protrusions. With respect to each light source of the plurality of light sources 60, the controlled angle θ and controlled thickness is configured such that the further the distance from a light source a protrusion is oriented on the component 48, the higher up on that protrusion the light from that light source will illuminate the protrusion.

For example, shown in FIG. 6 are protrusions 50a-50k of the plurality of protrusions 50. Light source 60a of the plurality of light sources 60 is in between the upper baffle 25 and lower baffle 26 to the left of the opening 23, and light source 60b of the plurality of light sources 60 is in between the upper baffle 25 and lower baffle 26 to the right of the opening. Protrusions 50a-50k are arranged on the component 48 in a row that is in alignment with light source 60a and light source 60b. Light source 60a has a controlled thickness and a controlled angle θ that is controlled by the upper baffle 25 and the lower baffle 26 to the left of the opening 23. The controlled angle θ and controlled thickness are configured such that the light produced by the light source 60a illuminates protrusion 50a proximate to the tip of protrusion 50a, illuminates protrusion 50b higher up on protrusion 50b than protrusion 50a, illuminates protrusion 50c higher up on protrusion 50c than protrusion 50b, and so on. Protrusion 50k will be illuminated by light source 60a at a position higher up on protrusion 50k than protrusion 50a, 50b, 50c, 50d, 50e, 50f, 50g, 50h, 50i, and 50j. The controlled angle θ and controlled thickness are also configured such that no portion of the background feature 41 of the component 48 is illuminated by the light produced by light source 60a. Light source 60b has a controlled thickness and a controlled angle θ that is controlled by the upper baffle 25 and the lower baffle 26 to the right of the opening 23. The controlled angle θ and controlled thickness of the light produced by light source 60*b* are configured such that the light produced by the light source 60*b* illuminates protrusion 50*k* proximate to the tip of protrusion 50*k*, illuminates protrusion 50*j* higher up on protrusion 50*j* than protrusion 50*k*, illuminates protrusion 50*i* higher up on protrusion 50*i* than protrusion 50*j*, and so on. Protrusion 50*a* will be illuminated by light source 60*b* at a position higher up on protrusion 50*a* than protrusion 50*b*, 50*c*, 50*d*, 50*e*, 50*f*, 50*g*, 50*h*, 50*i*, 50*j*, and 50*k*. The controlled angle θ and controlled thickness of the light produced by light source 60*b* are also configured such that no portion of the background feature 41 of the component 48 is illuminated by the light produced by light source 60*b*. The illumination of the protrusions 50*a*-50*k* at different heights along the protrusions 50*a*-50*k* is configured to prevent shadows of any protrusion 50*a*-50*k* preventing any other protrusion 50*a*-50*k* from being illuminated.

As an example, the controlled angles θ of the lights produced by light source 60*a* and 60*b* may be 1 or 2 degrees from the normal with respect to the direction 71. The controlled angles θ and controlled thicknesses of the lights produced by light source 60*a* and 60*b* may be adjustable depending on the size of component 48, and the length of the plurality of protrusions 50. As an example, the controlled angles may be 1 or 2 degrees from the normal with respect to the direction 71. For example, angle of the upper baffles 25 and lower baffles 26 with respect to the direction 71 may be adjustable, and the dimensions of the space in between the upper baffle 25 and lower baffle 26 to the left of the opening 23 may be adjustable, and the dimensions of the space in between the upper baffle 25 and the lower baffle 26 to the right of the opening 23 may be adjustable.

Figure 7:
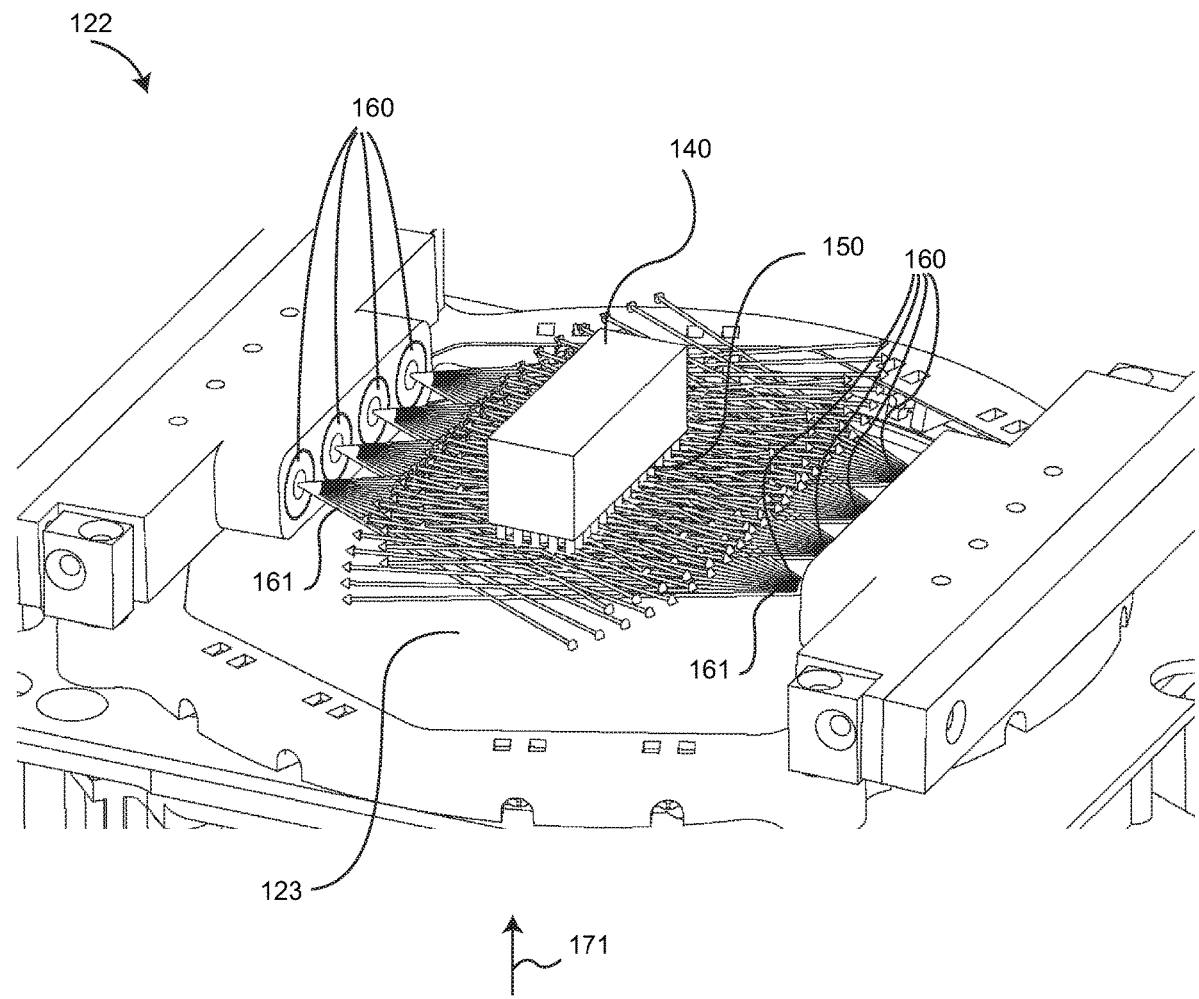
FIG. 7 depicts a perspective view of another embodiment of an illumination device with another component according to one embodiment.

Referring to FIG. 7, a perspective view of an embodiment of an illumination device 122 and a component 140 is shown. Instead of LEDs, illumination device 122 has a plurality of laser sources 160 on either side of opening 123. There are four laser sources 160 shown to the left of the opening 123 and four laser sources 160 shown to the right of the opening 123. The illumination device 122 may have any number and arrangement of laser sources 160. For example, the illumination device 122 may have one or more laser sources 160. The illumination device 122 may have a plurality of laser sources 160 arranged in a circle, square, triangle, or other shaped configuration about the opening 123. Each laser source of the plurality of laser sources 160 is shown producing a laser 161 covering a triangular area emerging from each laser source 160. The laser sources 160 may be configured to produce lasers having a differently shaped area. The angle of each laser 161 produced by each laser source may be adjustable by moving the laser source 160. Each laser 161 produced by the plurality of laser sources 160 has a controlled angle θ that is controlled by each of the plurality of laser sources 160.

A component 140 is shown positioned in opening 123 such that the plurality of lasers 160 are illuminating a plurality of protrusions 150 of the component 140. Illumination device 122 is shown without baffles. In another embodiment, illumination device 122 may have baffles, such as upper baffles and lower baffles that help control the angle and thickness of the lasers produced by the plurality of laser sources 160. The controlled angle θ of each laser 161 may be configured such that the controlled angle θ is non-normal with respect to the direction 71. Direction 171 is the direction in which an image capture device 11 is pointed to view the plurality of protrusions 150 of the component 140 when the protrusions 150 are illuminated by the illumination device 122. Direction 171 is shown pointing straight up towards the plurality of protrusions 150. In some embodiments, the direction 171 at which an image capture device 11 is pointed to view the plurality of protrusions 150 may be at another angle with respect to the component 140.

For example, the controlled angle θ of each laser 161 may be configured such that the laser 161 illuminates the protrusions of protrusions closest to each laser—which may be referred to as near protrusions—at a location on the near protrusion or near protrusions proximate to the tip of the near protrusion or near protrusions. With respect to each laser 161 produced by the plurality of lasers 160, the controlled angle θ and controlled thickness of each laser 161 may be configured such that the further the distance from a laser a protrusion is oriented on the component 140, the higher up on that protrusion the laser 161 will illuminate the protrusion. The controlled angle θ and controlled thickness is configured such that no portion of the background feature 141 (shown in FIG. 9 and described hereinafter) of the component 140 is illuminated by lasers 161 produced by the plurality of laser sources 160. Each laser source of the plurality of laser sources 160 may be configured such that the laser 161 each laser source 160 produces extends far enough to illuminate the protrusion or protrusions of the plurality of protrusions 150 that are farthest from that laser source 160. For example, as shown in FIG. 7, the laser sources 160 are shown producing lasers 161 that extend past the protrusions of the plurality of protrusions 150 that are farthest away from each laser source 160.

The component 140 may be an LCD display, which may have long lead tips that may comprise standoffs that are close to the ends of the lead tips. The plurality of laser sources 160 may configure the controlled angle θ and the controlled thickness of the lasers produced by the laser sources 160 such that the lasers illuminate the lead tips on the portions of the lead tips between the lead tip ends and the standoffs, without illuminating the standoffs.

Figure 8:
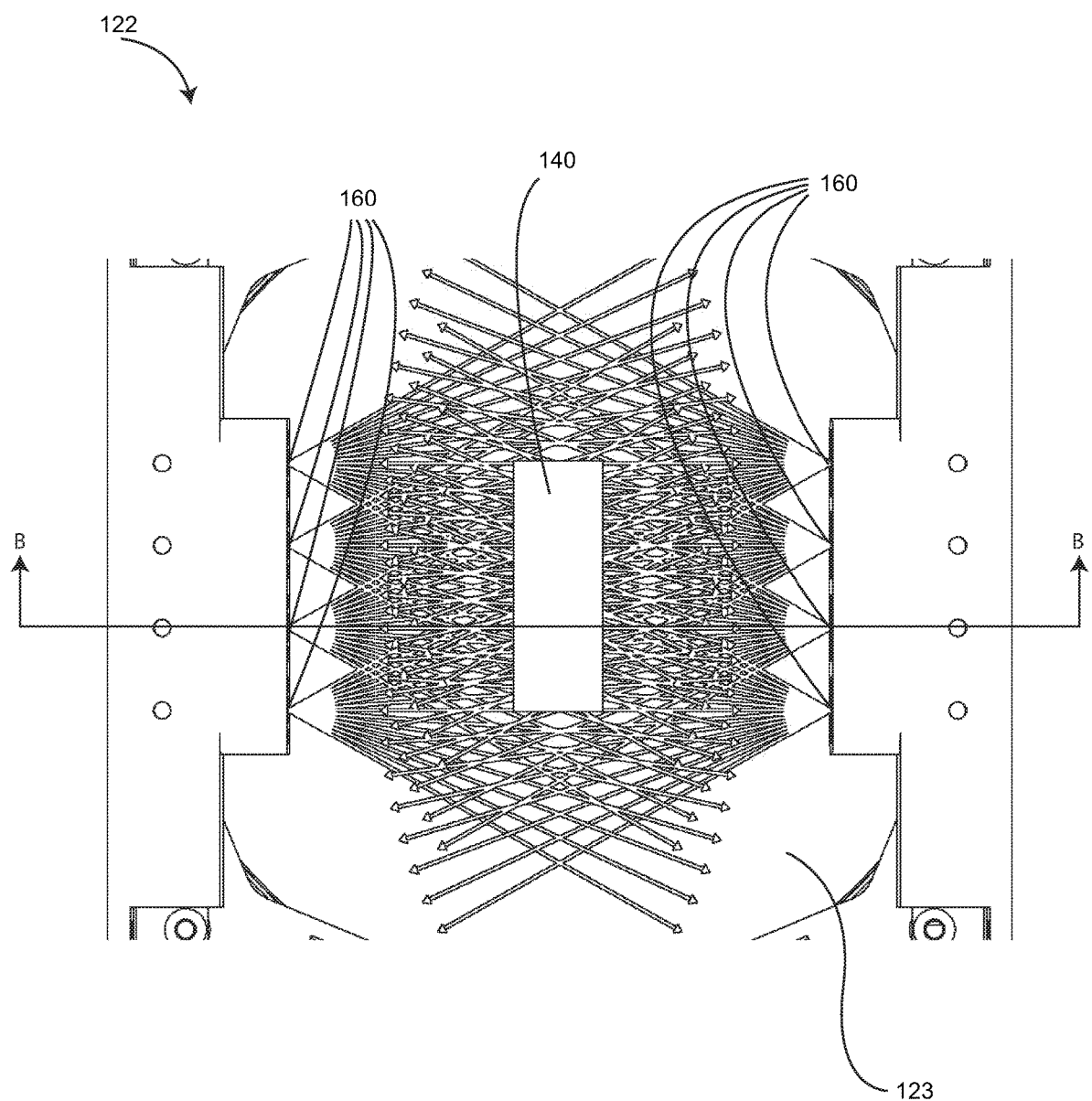
FIG. 8 depicts a top view of the illumination device and component of FIG. 7.

Shown in FIG. 8 is a top view of the illumination device 122 of FIG. 7. As shown, when a component 140 is moved into the opening 123, and the plurality of protrusions 150 are illuminated by the plurality of laser sources 160, the component 140 may be oriented in the opening 123 equidistant from the laser sources 160 shown on the left of the opening 123 and the laser sources 160 shown on the right of the opening 123.

Referring to FIG. 9, a cross section side view of an embodiment of illumination device 122 is shown. A laser 161*a* emerging from a laser source of the plurality of laser sources 160 is shown directed at the plurality of protrusions 150 of component 140 at a controlled angle θ that is non-normal with respect to direction 171. Laser 161*b* emerging from a laser source of the plurality of laser sources 160 is shown directed in the opposite direction of the laser 161*a* at a controlled angle θ that is non-normal with respect to direction 171. The protrusion 150*a* closest to the laser source 160 emitting laser 161*a* is thereby illuminated closer to the tip of protrusion 150*a* than protrusion 150*b*, which is illuminated higher—closer to the background feature 141— along protrusion 150*b* by laser 161*a*. Likewise, the protrusion 150*b* closest to the laser source emitting laser 161*b* is thereby illuminated closer to the tip of protrusion 150*b* than protrusion 150*a*, which is illuminated higher—closer to the background feature 141—along protrusion 150*a* by laser 161*b*. The controlled angle θ and controlled thickness of the lasers thereby causes each protrusion of the plurality of protrusions 150 to be illuminated such that the background feature 141 is not illuminated, and such that none of the protrusions 150 block any other protrusions 150 from being illuminated.

A method for illuminating a component, for example, component 40, 48, 140, may comprise providing a pick and place machine, such as pick and place machine 10 comprising a feeder system such as feeder system 16, a dispensing head, such as pick and place head 11, and a vision system. The vision system may comprise an image capture device such as image capture device 21, and an illumination device such as illumination device 22, 122. The illumination device may comprise a plurality of light sources such as plurality of light sources 60, 160. The method for illuminating a component may include feeding, by the feeder system, a component to a picking location; picking, by the dispensing head, a fed component from the picking location; pointing the image capture device in a direction, such as direction 71, 171; producing, by each of the plurality of light sources, a light; controlling, by the illumination device, a thickness of each light; controlling, by the illumination device, a controlled angle $\theta$ of each light relative to the direction such that each controlled angle $\theta$ is non-normal with respect to the direction; illuminating, by the plurality of light sources, features of the fed component; capturing, by the image capture device, an image of the fed component; and detecting, by the vision system, features of the fed component.

An illumination device provided in a method of illuminating a component may comprise a housing including an outer edge, the upper baffle, and the lower baffle, wherein the upper baffle and the lower baffle extend inward from the outer edge, wherein the plurality of light sources are disposed at or proximate the outer edge, wherein the housing includes an opening that extends between a first side of the outer edge to a second side of the outer edge; and the illuminating, by the plurality of light sources, features of the fed component may comprise illuminating, by the plurality of light sources, the fed component in the opening.

Controlling, in a method of illuminating a component, by an illumination device, each thickness of each light may comprise controlling, by an upper baffle and a lower baffle, each thickness of each light, and the illuminating, by a plurality of light sources, features of a fed component may comprise illuminating, by the plurality of light sources, each lead tip of a plurality of lead tips of the fed component such that a background feature of the fed component is not illuminated.

A plurality of light sources in a method of illuminating a component may comprise a plurality of LEDs. A plurality of light sources in a method of illuminating a component may comprise a plurality of lasers.

An opening of an illumination device in a method of illuminating a component may be a channel extending across a housing of an illumination device; and the method of illuminating a component may comprise moving, by a dispensing head, a fed component through the channel, and detecting, by a vision system, features of the fed component may comprise detecting, by the vision system, features of the fed component while the fed component is being moved by the dispensing head through the channel on the fly.

A housing of an illumination device in a method for illuminating a component may be ring shaped.

A channel of an illumination device in a method for illuminating a component may include a widened portion proximate a center of a ring-shaped housing of the illumination device and the method may comprise receiving, by the widened portion proximate to the center of the ring-shaped housing, a component larger than the width of the channel at an outer edge of the ring-shaped housing.

Each controlled angle $\theta$ of light in a method of illuminating a component may be equal. Each controlled angle $\theta$ of light in a method of illuminating a component may be 1 or 2 degrees from the normal with respect to a direction that an image capture device is pointed.

A method of illuminating a component may comprise orienting each light source of the plurality of light sources at the controlled angle that is non-normal with respect to the direction.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A pick and place machine comprising:
    a feeder system configured to feed components to a picking location;
    a dispensing head including a spindle, the dispensing head configured to pick fed components from the picking location;
    a vision system configured to detect features of components picked by the dispensing head, the vision system comprising:
        an image capture device pointed in a direction; and
        an illumination device, the illumination device comprising:
            a plurality of light sources each configured to produce light having a controlled thickness and at a controlled angle relative to the direction, wherein the controlled angle is configured to be non-normal with respect to the direction;
            a housing including an outer edge, wherein the housing includes an opening that extends between a first side of the outer edge and a second side of the outer edge,
            wherein the housing includes an upper baffle and a lower baffle, wherein the upper baffle and lower baffle extend inward from the outer edge,
            wherein the opening is configured to receive at least one of the components,
            wherein the light is configured to illuminate features of the at least one of the components in the opening, and
            wherein each light source of the plurality of light sources is disposed in between the upper baffle and the lower baffle, wherein the upper baffle and lower baffle are configured to control each of the controlled angles of the lights.

2. The pick and place machine of claim 1,
    wherein the plurality of light sources are disposed at or proximate the outer edge.

3. The pick and place machine of claim 1, wherein the upper baffle and the lower baffle are configured to control each of the controlled angles and each of the controlled thicknesses such that each lead tip of a plurality of lead tips of an inspected component is illuminated by the light, and such that a background feature of the inspected component is not illuminated by the light.

4. The pick and place machine of claim 1, wherein the plurality of light sources comprises a plurality of LEDs.

5. The pick and place machine of claim 1, wherein the plurality of light sources comprises a plurality of lasers.

6. The pick and place machine of claim 1, wherein the opening is a channel extending across the housing of the illumination device, wherein the vision system is configured to detect features of components moved through the channel by the dispensing head on the fly.

7. The pick and place machine of claim 6, wherein the housing is ring shaped.

8. The pick and place machine of claim 7, wherein the channel includes a widened portion proximate a center of the ring configured to receive a component larger than a width of the channel at the outer edge of the housing.

9. The pick and place machine of claim 1, wherein each of the controlled angles is equal.

10. The pick and place machine of claim 1, wherein each of the controlled angles is 1 or 2 degrees from the normal with respect to the direction.

11. The pick and place machine of claim 1, wherein each light source of the plurality of light sources is oriented at the controlled angle that is non-normal with respect to the direction.

12. A vision system configured to detect features of components picked by a dispensing head, the vision system comprising:
   an image capture device pointed in a direction; and
   an illumination device comprising:
      a plurality of light sources each configured to produce light having a controlled thickness and at a controlled angle relative to the direction, wherein the controlled angle is configured to be non-normal with respect to the direction;
      a housing including an outer edge, wherein the housing includes an opening that extends between a first side of the outer edge and a second side of the outer edge,
      wherein the housing includes an upper baffle and a lower baffle, wherein the upper baffle and lower baffle extend inward from the outer edge,
      wherein the opening is configured to receive at least one of the components,
      wherein the light is configured to illuminate features of the at least one of the components in the opening, and
      wherein each light source of the plurality of light sources is disposed in between the upper baffle and the lower baffle, wherein the upper baffle and lower baffle are configured to control each of the controlled angles of the lights.

13. The vision system of claim 12,
   wherein the plurality of light sources are disposed at or proximate the outer edge.

14. The vision system of claim 12, wherein the upper baffle and the lower baffle are configured to control each of the controlled angles and each of the controlled thicknesses such that each lead tip of a plurality of lead tips of an inspected component is illuminated by the light, and such that a background feature of the inspected component is not illuminated by the light.

15. The vision system of claim 12, wherein the plurality of light sources comprises a plurality of LEDs.

16. The vision system of claim 12, wherein the plurality of light sources comprises a plurality of lasers.

17. The vision system of claim 12, wherein the opening is a channel extending across the housing of the illumination device, wherein the channel is configured to receive the components such that the components move through the channel.

18. The vision system of claim 17, wherein the housing is ring: shaped.

19. The vision system of claim 18, wherein the channel includes a widened portion proximate a center of the ring configured to receive a component larger than a width of the channel at the outer edge of the housing.

20. The vision system of claim 12, wherein each of the controlled angles is equal.

21. The vision system of claim 12, wherein each of the controlled angles is 1 or 2 degrees from the normal with respect to the direction.

22. The vision system of claim 12, wherein the plurality of light sources is configured to illuminate a portion of a component, wherein the image capture device is configured to capture an image of the portion of the component illuminated by the illumination device, and wherein the vision system is configured to detect a position of features of the portion of the component that is illuminated by the illumination device.

23. The vision system of claim 12, wherein each light source of the plurality of light sources is oriented at the controlled angle that is non-normal with respect to the direction.

24. A method of illuminating a component comprising:
   providing a pick and place machine comprising:
      a feeder system;
      a dispensing head; and
      a vision system comprising:
         an image capture device; and
         an illumination device comprising;
            a plurality of light sources;
            a housing including an outer edge, wherein the housing includes an opening that extends between a first side of the outer edge and a second side of the outer edge,
            wherein the housing includes an upper baffle, and a lower baffle, wherein the upper baffle and lower baffle extend inward from the outer edge,
            wherein each light source of the plurality of light sources is disposed in between the upper baffle and lower baffle;
   feeding, by the feeder system, the component to a picking location;
   picking, by the dispensing head, the fed component from the picking location;
   pointing the image capture device in a direction;
   producing, by each of the plurality of light sources, a light configured to illuminate features of the fed component;
   controlling, by the illumination device, a thickness of each light;
   controlling, by the illumination device, a controlled angle of each light relative to the direction such that each controlled angle is non-normal with respect to the direction;
   illuminating, by the plurality of light sources, features of the fed component;
   capturing, by the image capture device, an image of the fed component; and
   detecting, by the vision system, features of the fed component.

25. The method of illuminating a component of claim 24, wherein the plurality of light sources are disposed at or proximate the outer edge
wherein the illuminating, by the plurality of light sources, features of the fed component comprises illuminating, by the plurality of light sources, the fed component in the opening.

26. The method of illuminating a component of claim 24, wherein the controlling, by the illumination device, each thickness of each light comprises controlling, by the upper baffle and the lower baffle, each thickness of each light;
wherein the illuminating, by the plurality of light sources, features of the fed component comprises illuminating, by the plurality of light sources, each lead tip of a plurality of lead tips of the fed component such that a background feature of the fed component is not illuminated.

27. The method of illuminating a component of claim 24, wherein the plurality of light sources comprises a plurality of LEDs.

28. The method of illuminating a component of claim 24, wherein the plurality of light sources comprises a plurality of lasers.

29. The method of illuminating a component of claim 24, wherein the opening is a channel
extending across the housing of the illumination device; wherein the method further comprises:
moving, by the dispensing head, the fed component through the channel;
wherein the detecting, by the vision system, features of the fed component comprises detecting, by the vision system, features of the fed component while the fed component is being moved by the dispensing head through the channel on the fly.

30. The method of illuminating a component of claim 29, wherein the housing is ring-shaped.

31. The method of illuminating a component of claim 30, wherein the channel includes a widened portion proximate a center of the ring; wherein the method further comprises:
receiving, by the widened portion proximate to the center of the ring, a component larger than a width of the channel at the outer edge of the housing.

32. The method of illuminating a component of claim 24, wherein each of the controlled angles is equal.

33. The method of illuminating a component of claim 24, wherein each of the controlled angles is 1 or 2 degrees from the normal with respect to the direction.

34. The method of claim 24, wherein the controlling, by the illumination device, further comprises orienting each light source of the plurality of light sources at the controlled angle that is non-normal with respect to the direction.

* * * * *